United States Patent
Rou et al.

(10) Patent No.: US 7,041,205 B2
(45) Date of Patent: *May 9, 2006

(54) SPUTTERING TARGET AND METHOD FOR MAKING COMPOSITE SOFT MAGNETIC FILMS WITH A SINTERED TARGET

(75) Inventors: Shanghsien Rou, Fremont, CA (US); Qixu Chen, Milpitas, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 150 days.

This patent is subject to a terminal disclaimer.

(21) Appl. No.: 10/657,067

(22) Filed: Sep. 9, 2003

(65) Prior Publication Data

US 2004/0045809 A1    Mar. 11, 2004

Related U.S. Application Data

(63) Continuation-in-part of application No. 10/067,833, filed on Feb. 8, 2002, now Pat. No. 6,692,219.

(60) Provisional application No. 60/312,329, filed on Aug. 14, 2001.

(51) Int. Cl.
    *C23C 14/35*    (2006.01)

(52) U.S. Cl. .............................. 204/298.13; 204/192.2; 204/192.12; 204/192.15

(58) Field of Classification Search ........... 204/298.12, 204/298.13, 298.16, 192.12, 192.2, 192.15

See application file for complete search history.

(56) References Cited

U.S. PATENT DOCUMENTS

| | | | |
|---|---|---|---|
| 6,033,536 A | | 3/2000 | Ichihara et al. .......... 204/192.2 |
| 6,692,619 B1 * | | 2/2004 | Chen et al. ............... 204/192.2 |

* cited by examiner

*Primary Examiner*—Steven Versteeg
(74) *Attorney, Agent, or Firm*—Morrison & Foerster LLP

(57) ABSTRACT

High-saturation magnetization composite soft magnetic films can be deposited with sintered targets made of preferably at least two kinds of powders/elements with much lower saturation magnetization than that of the deposited soft magnetic films. Such a high-saturation magnetization composite soft magnetic film can be deposited by sputtering a plurality of species from a sintered target that forms a film of a material of higher saturation magnetization than that of the species.

18 Claims, 6 Drawing Sheets

Phase A

Phase B

SPUTTERING TARGET AND METHOD FOR MAKING COMPOSITE SOFT MAGNETIC FILMS WITH A SINTERED TARGET

RELATED APPLICATIONS

This application is a continuation-in-part of Ser. No. 10/067,833, filed Feb. 8, 2002, issued as U.S. Pat. No. 6,692,619, which claims priority from Provisional Application Ser. No. 60/312,329 filed Aug. 14, 2001, entitled "Method for Making Composite Soft Magnetic Films," the entire disclosures of which are hereby incorporated herein by reference.

FIELD OF INVENTION

This invention relates to a sputtering target and method of making a soft magnetic film of a recording head or recording media, such as those in thin film magnetic recording.

BACKGROUND

Composite soft magnetic thin films are widely used in commercial applications, for instance, in magnetic recording heads. Also, a perpendicular magnetic recording medium usually has a soft magnetic underlayer of about 2000 Å thickness, which is conventionally made with magnetron sputtering. Magnetron sputtering has several advantages over diode sputtering, such as high deposition rate. It is very difficult, however, to use magnetron sputtering for soft magnetic materials because the targets of soft magnetic materials shunt the magnetic flux from the magnets of magnetron cathodes. Therefore, in order to properly operate the magnetron, a magnetic field of more than 150 Oe is required to be applied above and parallel to the target surface. However, when the magnetic field is about 150 Oe, the deposition rate of soft magnetic materials is still very slow. The conventional method for enabling the magnetron function for soft magnetic materials is to reduce the target thickness to minimize the shunting effect of the target. Even though the magnetron can marginally work by this method, the deposition rate is still too low.

In a perpendicular recording medium, the thickness of the soft magnetic layer is about 2000 Å. This thickness is much larger than the thickness of other layers in the perpendicular recording medium. For example, the thickness of the interlayer, recording layer and overcoat are about 50 Å, about 200 Å, and about 40 Å, respectively. The low deposition rate of the soft magnetic underlayer significantly reduces throughput. Also, thin targets significantly increase shutdown time of sputter machines for changing targets, and are not feasible for mass production.

U.S. Pat. No. 6,033,536 (Ichihara) discloses a magnetron sputtering method using a composite sputtering target consisting of a material having a maximum relative magnetic permeability of 50 or more or consisting of a soft magnetic material which contains two or more phases selected from the group consisting of an M-X alloy phase, an M phase, and an X phase in that at least the simple substance phase consisting of the phase with the smaller atomic weight, M or X, is included, with the proviso that M is not equal to X, M is at least one element selected from the group consisting of Fe, Co and Ni, and X is at least one element selected from the group consisting of Fe, Al, Si, Ta, Zr, Nb, Hf and Ti. In particular, in column 11, lines 19 and 20, Ichihara discloses forming a NiFe film by using a target consisting of a NiFe alloy phase and a Fe phase.

While Ichihara discloses a composite sputtering target (see FIG. 8 of Ichihara) and a magnetron sputtering method, Ichihara is totally different from this invention. Ichihara concerns mainly with the composition consistence of the deposited films. The criterion for the composition of the composite sputtering target of Ichihara is based on atomic weight of the constituent materials (phases) of the target, not the saturation magnetization (Ms) of the constituent materials with respect to the saturation magnetization of the materials with identical composition as that of the resulting composite soft magnetic films. In particular, Ichihara requires that at least one phase of the target must be a simple substance phase having a smallest atomic weight relative to the atomic weights of M and X. Therefore, for forming a NiFe film, Ichihara uses a NiFe alloy phase (M=Ni and X=Fe) and a Fe phase (X=Fe), wherein the simple substance phase, i.e., Fe, has the smallest atomic weight relative to Ni and Fe. However, according to Ichihara, the simple substance phase having the smallest atomic weight, e.g., Fe, has a higher saturation magnetization than that of the sputter deposited film, e.g., NiFe. It is, therefore, more difficult to sputter-deposit Fe by magnetron than FeNi, when saturation magnetization is the main concern.

There are several problems in Ichihara's method, which need to be solved. For example, the erosion of the target of FIG. 8 of Ichihara will not be uniform during sputtering because the magnetic field along the circumferential direction above this target surface will not be uniform, but will change dramatically. The field will be very strong above the Zr phase, and weak above the Fe and FeZr phases, resulting in non-uniform erosion of this target in the circumferential direction.

The soft magnetic target materials do not operate at the maximum permeability regime for a magnetron sputtering application. The magnetic field above the target surface in the plasma and parallel to the target surface must be greater than about 150 Oe to enable magnetron sputtering. The magnetic fields inside and outside the target surface at an area near the target surfaces and parallel to the surfaces of a target are nearly identical. Therefore, the magnetic field inside the target would be about 150 Oe or more. The highest magnetic induction of the widely used soft magnetic materials is known to be about 24000 Gauss. When B=24000 Gauss and H=150 Oe, $\mu$=160 because B=$\mu$H, where B is magnetic induction, $\mu$ is permeability, and H is magnetic field. This value of permeability is 2 to 3 orders of magnitude lower than the maximum permeability of most of commercial metallic soft magnetic materials. Therefore, maximum permeability of the target materials is not a concern of this invention. Instead, this invention is concerned with the problem of high saturation magnetization of the target materials, which is the cause of low pass through flux above the target surface.

Despite some advances in magnetron sputtering of soft magnetic films, there still is a need to find a method that can be used for efficient production of soft magnetic films with single-phase and substantially uniform composition by magnetron sputtering.

SUMMARY OF THE INVENTION

This invention relates to a target for magnetron sputtering, comprising a plurality of species that form a film comprising a material of higher saturation magnetization than that of the species, wherein the target is a sintered target. The target could be made of at least two kinds of powders of a lower saturation magnetization than that of a deposited film using the target. Generally, the target sputters to form a film having a substantially uniform thickness and a substantially uniform composition throughout the film. Preferably, the target comprises multiple single-phase regions. In one embodiment, each single-phase region is less than 1 mm in size while in another embodiment each single-phase region is less than 200 μm in size. Preferably, the multiple single-phase regions comprise a phase comprising Fe, Ni, B, Co, Ta, Zr, C or combinations thereof. Preferably, the target is made by a sintering process. The sintering process could be a hot pressing process or a hot isostatic pressing process. The sintered target is formed from a material selected from the group consisting of a simple element, an alloy, a compound and combination thereof.

Another embodiment is a sputtering method, comprising disposing a substrate opposite a target, applying a magnetic field to the target, applying a sputtering voltage to the target and sputtering a film on the substrate, the target comprising a plurality of species that form a film comprising a material of higher saturation magnetization than that of the species, wherein the target is a sintered target.

Yet another embodiment is a sputtering source, comprising a magnet and means for sputtering a plurality of species that form a film comprising a material of higher saturation magnetization than that of the species, wherein the target is a sintered target. In this invention, "means for sputtering a plurality of species that form a film" includes a sputtering target.

As will be realized, this invention is capable of other and different embodiments, and its details are capable of modifications in various obvious respects, all without departing from this invention. Accordingly, the drawings and description are to be regarded as illustrative in nature and not as restrictive.

DETAILED DESCRIPTION

Figure 1:
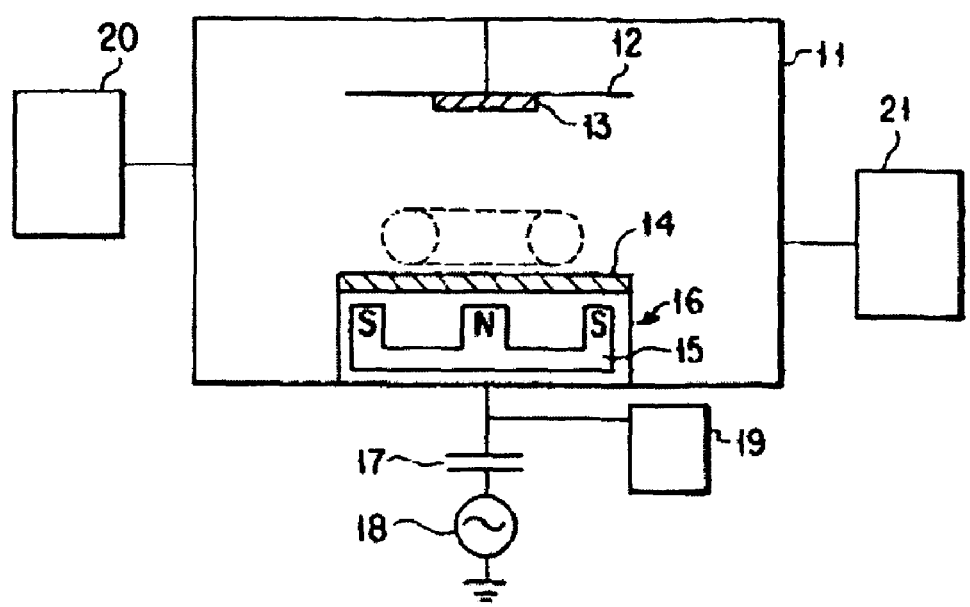
FIG. 1 is a view of a typical magnetron sputtering apparatus.

An embodiment of this invention is a magnetron target for sputtering, comprising at least a first sector comprising a first target material $T_1$ having a saturation magnetization $Ms_1$ and a second sector comprising a second target material $T_2$ having a saturation magnetization $Ms_2$, wherein $Ms_1<Ms_3$ and $Ms_2<Ms_3$, wherein $Ms_3$ is the saturation magnetization of a bulk material $T_3$ with the composition of a film formed by co-sputtering $T_1$ and $T_2$.

In one embodiment, the first and second sectors are pie-shaped sectors and located along the racetrack of the magnetron, wherein preferably $0.9<Ms_2/Ms_1<1.1$. The target sputters $T_1$ and $T_2$ to form a single-phase film having a substantially uniform thickness and a substantially uniform composition of $T_3$ throughout the single-phase film.

In another embodiment the first and second sectors are concentric ring-shaped sectors with sectors $T_1$ and $T_2$ located along radial direction, wherein preferably each sector has its own power supply.

In one embodiment, $T_1$ comprises $FeNi_x$ and $T_2$ comprises $FeNi_y$, wherein x is in a range from about 29 to about 35 in weight percent and y is in the range from about 70 to 100 in weight percent. In yet another embodiment, $T_1$ comprises a moiety selected from Fe, FeNi and FeB and $T_2$ comprises a moiety selected from Ni, FeNi and Co. In a preferred embodiment, $T_1$ is $FeNi_{32}$ and $T_2$ is Ni. Furthermore, $T_1$ and/or $T_2$ can further comprise an additive selected from Mo, Cr, Mn, Cu, V, C, B, Nb, Zr, Ta and Hf.

Another embodiment is a sputtering method, comprising disposing a substrate opposite a target, applying a magnetic field to the target, applying a sputtering voltage to the target and sputtering a film on the substrate, the target comprising at least a first sector comprising a first target material $T_1$ having a saturation magnetization $Ms_1$ and a second sector comprising a second target material $T_2$ having a saturation magnetization $Ms_2$, wherein $Ms_1<Ms_3$ and $Ms_2<Ms_3$, wherein $Ms_3$ is the saturation magnetization of a bulk material $T_3$ with the composition of the film.

In this invention, the term "single-phase" refers to a phase in which different elements are in contact with each other at an atomic level without a boundary between elements that can be observable by optical microscopy.

The term "bulk material" refers to a material having a thickness of 0.1 μm or more. The term "film" refers to a material having a thickness in a range of more than 0 μm and less than 0.1 μm.

The term "substantially uniform thickness" of a film refers to a thickness of a film in which the maximum and minimum thickness of the film, $t_{max}$, and $t_{min}$, have the following relationship:

$$(t_{max}-t_{min})/t_{max} \leq 0.1 \qquad (1a).$$

The term "substantially uniform composition" refers to a composition in which the maximum and minimum concentrations of an element, $C_{max}$ and $C_{min}$, in the composition have the following relationship:

$$(C_{max}-C_{min})/C_{max} \leq 0.1 \qquad (1b).$$

The method of the present invention is particularly effective in sputter depositing a soft magnetic film having a single-phase and substantially uniform composition by magnetron sputtering. The soft magnetic film is formed by sputtering materials of a composite target during magnetron sputtering. The materials of the composite target have a lower saturation magnetization than that of the target, which otherwise will be used to produce the resulting soft magnetic film. For example, the soft magnetic film could be a $FeNi_{46.4}$ film and the materials of the composite target could be $FeNi_{32}$ and Ni.

FIG. 1 shows a typical magnetron sputtering apparatus, such as that of Ichihara, which can be used in the present invention according to the following method. In FIG. 1, in a sputtering chamber 11, a holder 12 is placed. On the holder 12, a substrate 13 is mounted. Also, in the sputtering chamber 11, there is provided a sputtering source 16 consisting of a target 14 and a concentric-type permanent magnet 15 for magnetron discharge disposed on the rear surface of the target 14. The target 14 is connected to a radio frequency power supply 18 via a direct current cut-off capacitance 17. A detector 19 monitors the cathode fall voltage (direct current self bias voltage $V_{DC}$) applied to the target 14. The sputter chamber 11 is evacuated by an evacuation system 20 and a sputtering gas is introduced into the chamber 11 from the gas introducing system 21. Above the target 14, toroidal magnetron plasma is generated. A portion of the target 14 corresponding to the inner side of the magnetron plasma is eroded. The substrate 13 is fixed on the holder 12 right over the eroded portion of the target 14.

FeNi and FeCo alloys are often used as a soft magnetic material. To obtain data necessary for designing the sputtering target of this invention for forming FeNi and FeCo soft magnetic films, the following basic experiments were designed and could be performed in the aforementioned apparatus.

EXAMPLE 1

Figure 2:
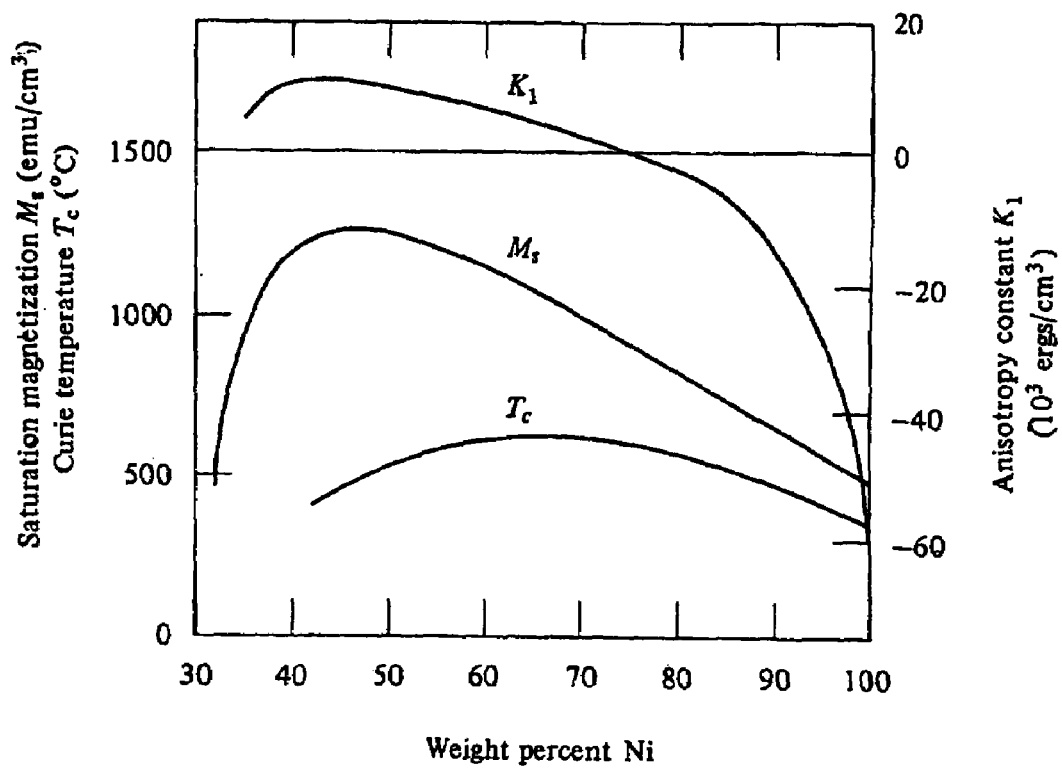
FIG. 2 shows the variations in saturation magnetization, Curie temperature Tc and anisotropy constant $K_1$ (quenched alloys) with Ni content in a FeNi alloy.

The maximum saturation magnetization of FeNi occurs around Ni 46.4 weight %, as illustrated in FIG. 2 obtained from Cullity, "Introduction to Magnetic Materials", page 526, 1972, Addison-Wesley Publishing Company. Composite soft magnetic films are widely used at the composition corresponding to maximum saturation magnetization. For the case of FeNi, the composition is $FeNi_{46.4}$. The saturation magnetization values of a FeNi alloy for selected compositions are shown on Table I.

TABLE I

| Saturation magnetization of FeNi alloy. | |
|---|---|
| Ni (weight %) | Saturation magnetization (emu/cc) |
| 46.4 | 1275 |
| 32 | 500 |
| 100 | 500 |
| 32.2 | 567 |
| 95 | 567 |

Co-sputtering $FeNi_{32}$ and Ni in a magnetron could deposit a $FeNi_{46.4}$ film. Similarly, co-sputtering $FeNi_{32.2}$ and $FeNi_{95}$ in a magnetron could deposit a $FeNi_{46.4}$ film also. Here neither $FeNi_{32.2}$ nor $FeNi_{95}$ are simple substance phase. The saturation magnetization of $FeNi_{32.2}$ and Ni is 0.39 of that of $FeNi_{46.4}$. Assuming identical magnetron cathodes are used for $FeNi_{32}$ and Ni sectors, the ratio X of target area of Ni to the total target area of $FeNi_{32}$ and pure Ni can be expressed by equation (2) for depositing a film with composition of $FeNi_{46.4}$.

$$X=(46.4-32)/(100R-32) \quad (2)$$

wherein R is deposition rate ratio of Ni over $FeNi_{32}$. If Ni and $FeNi_{32}$ have identical deposition rate, X=21.2%.

Our analysis shows that the magnetic field parallel to the target surface at the surface of the soft magnetic target can be approximately represented by equation (3).

$$H=a-B_s tb \quad (3)$$

wherein H is the magnetic field parallel to target surface at the surface of the target, $B_s$ is saturation magnetic induction of the target, t is the thickness of the target, a is a constant related to the remanent magnetic induction of the magnets and geometry of the magnetron, and b is a constant related to the geometry of the magnetron. The variables of equation (3) are H, $B_s$, and t. By using $FeNi_{32}$ and Ni as the materials of a composite target instead of using a single component $FeNi_{46.4}$ target, the magnetic field at the target surface is significantly enhanced. For an identical magnetic field in the experimental design, a target thickness can be used for a composite $FeNi_{32}$ and Ni target that is 2.55 times the thickness of a single component $FeNi_{46.4}$ target.

EXAMPLE 2

FeCo-alloy has a very high saturation magnetization. The maximum saturation magnetization, which is higher than that of pure Fe and much higher than that of pure Co, occurs around 30 atomic percent of Co. Additives, other than Co, Ni, Ir, Pt, and Rh, into Fe-alloy usually reduce saturation magnetization of Fe-alloy. Additives, other than Fe, into Co-alloy usually reduce saturation magnetization of Co-alloy. The soft magnetic film of FeCo-alloy can be co-sputter deposited with Fe-alloy and Co-alloy. For instance, FeCoB films can be co-sputtered with FeB and pure Co. Both of FeB and Co have lower saturation magnetization than that of FeCoB.

EXAMPLE 3

Figure 3:
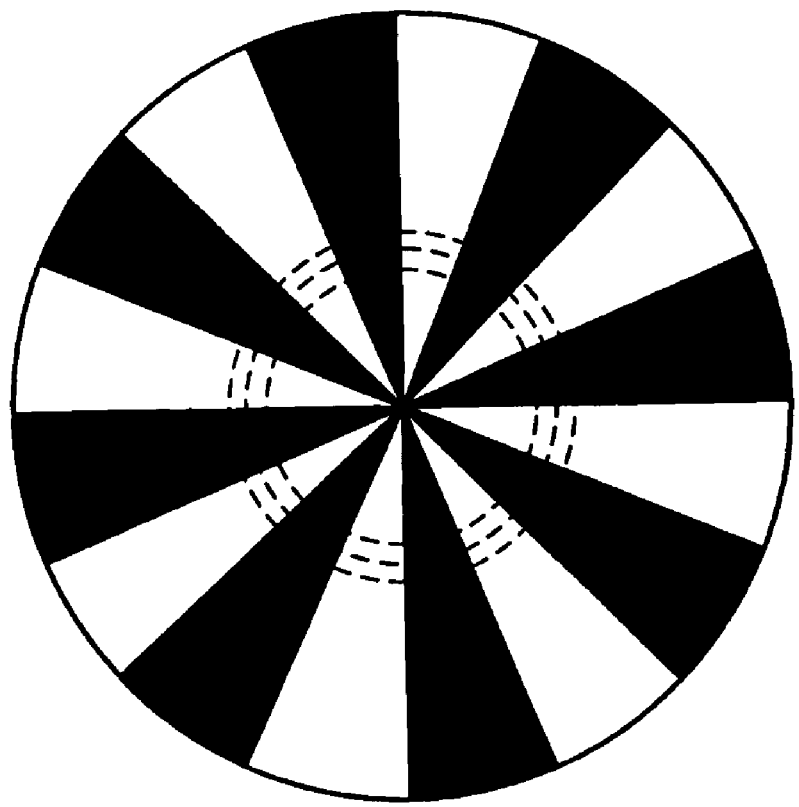
FIG. 3 shows the configuration of a pie-shaped composite target.

FIG. 3 shows one example of target configuration according to this invention. The circular magnetron creates racetrack erosion pattern around the area represented by dashed lines. Two kinds of pie-shaped mosaic sectors comprising target materials, for example, $FeNi_{32}$ and Ni, are located along the donut shaped racetracks of FIG. 3.

The boundary of these two kinds of pie-shaped sectors of the target should be approximately perpendicular to the racetrack direction. The target with area ratio, i.e. the arc length ratio along the racetrack, according with equation (2) will yield a film with $FeNi_{46.4}$ composition.

These pie-shaped sectors can be bonded to a common backing plate or cramped together. When the arc length of the pie-shaped target sectors along the racetrack is small enough, for instance less than 1 cm, depending on the target to substrate distance and other factors, a substantially uniform thickness and substantially uniform composition of the deposited film is achieved. All these target sectors could share one common target power supply or, optionally, multiple power supplies. When $FeNi_{32}$ and Ni are co-sputtered using the pie-shaped target, very uniform erosion is obtained, because $FeNi_{32}$ and Ni have identical saturation magnetization. When $0.9<Ms_2/Ms_1<1.1$, the pie-shaped target is eroded uniformly.

EXAMPLE 4

Figure 4:
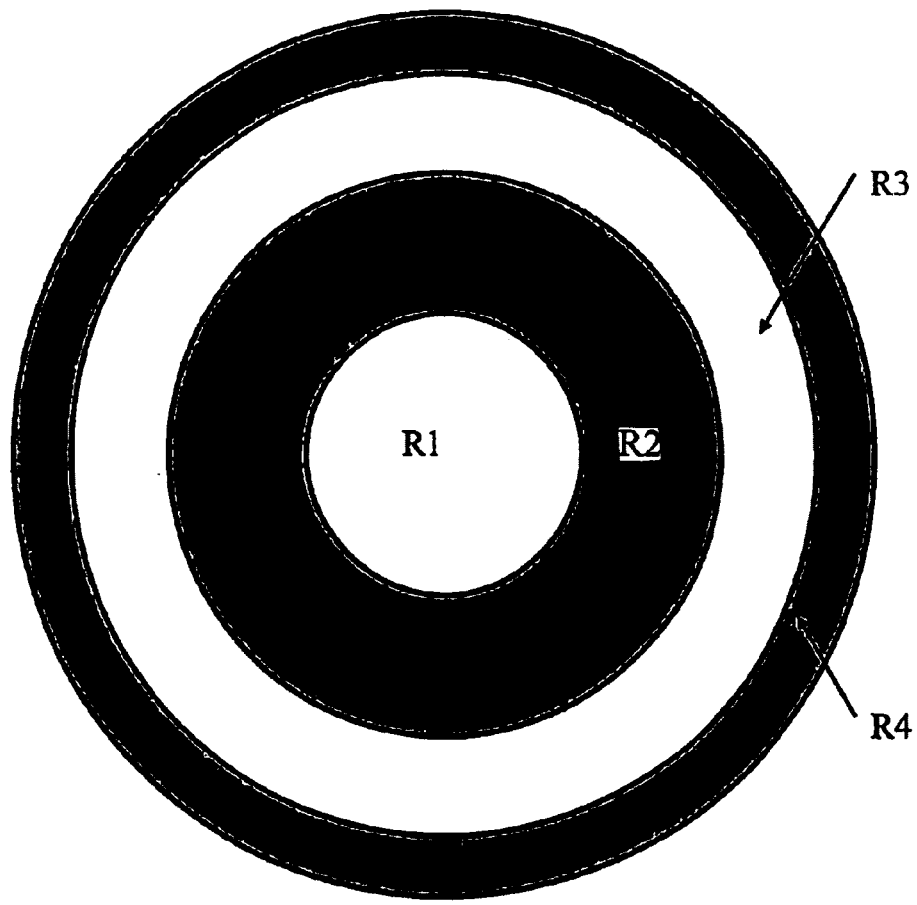
FIG. 4 shows the configuration of an annular nested target.

FIG. 4 shows another example of a target configuration according to this invention. The complete annular concentric nested target has rings (R1, R2, R3 and R4) of alternative materials/compositions A and B. Each ring has its own magnetron magnets and own target power supply. These rings are electrically separated in the composite annular target. Even though materials A and B could have very different saturation magnetization, a substantially uniform film in terms of the composition and thickness can be sputter deposited with such a target. The sputter deposited film formed by co-sputtering species from this target can have no composition gradient and can comprise of a single-phase. This is possible as explained below by referring to FIG. 5.

Figure 5:
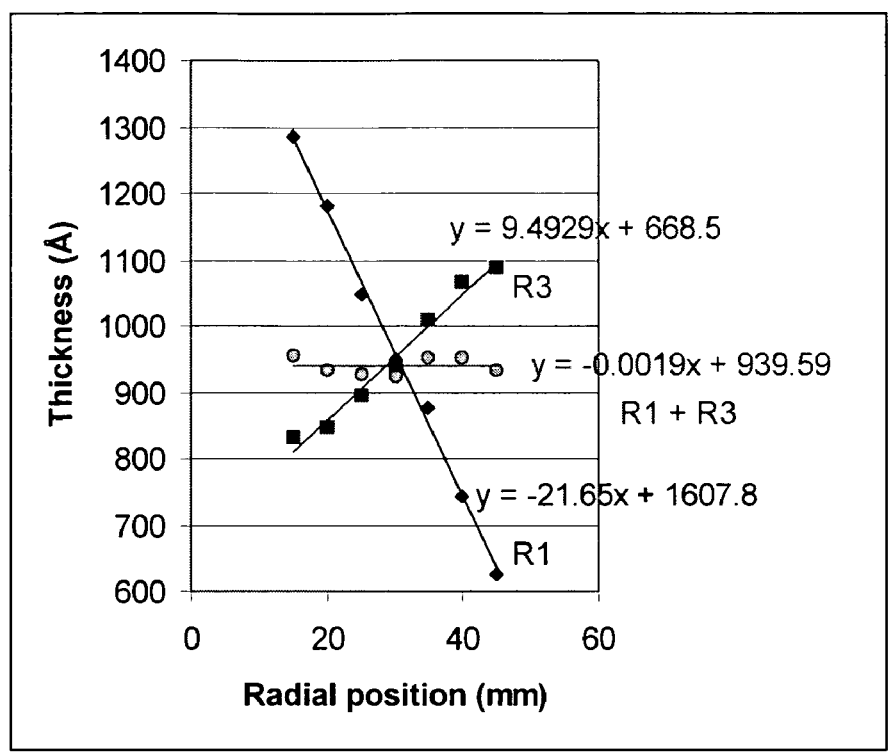
FIG. 5 shows the thickness distribution along the radial direction of a magnetic recording disc sputtered from ring R1 alone, ring R3 alone, and co-sputtered from rings R1 and R3 combined, of the annular nested target of FIG. 4.

FIG. 5 shows the thickness distribution along the radial direction of a magnetic recording disc sputtered from ring R1 alone, ring R3 alone, and co-sputtered from rings R1 and R3 combined, of the annular nested target of FIG. 4. The distance between the target and substrate planes is 50 mm. The outside and inside diameters of R3 are 160 and 112 mm, respectively. The outside diameter of R1 is 56 mm. A CoCrPt alloy is the material of the sputter deposited film. The deposition duration is 40 seconds. The target powers used for R1 and R3 are 300 W and 1000 W, respectively. A linear fitting gives two equations for the thickness Y as a function of the radial position X:

$$Y_3 = 9.4929X + 668.5 \quad (4)$$

$$Y_1 = -21.65X + 1607.8 \quad (5)$$

When rings R1 and R3 are co-sputtered with identical duration and with sputtering powers of α300 W and β1000 W respectively, and when α and β satisfy equation (6), the co-sputter deposited film along radial direction has constant thickness Y.

$$9.4929\beta - 21.65\alpha = 0 \quad (6)$$

The circle points on FIG. 5 are calculated points from equation (6) for co-sputtering of 40 seconds with 90 W for R1 and 684 W for R3. This demonstrates that when R1 and R3 have identical composition, a film of a very uniform thickness can be deposited. When $FeNi_{32}$ and Ni are both deposited in this way, the co-sputtered $FeNi_{32}$ and pure Ni ring-shape sectors produce uniform $FeNi_{46.4}$ film in composition and thickness.

The composite soft magnetic films according to this invention are not limited to $FeNi_{46.4}$. Other composite soft magnetic films, such as FeNi, FeNiMo, FeNiCr, FeNiMn, FeNiCu, FeNiCuCr, FeNiMoMn, CoFe, CoFeV, CoFeC, CoFeB, CoNiFe, CoFeNiB, CoFeNiNb, CoFeNiZr, CoFeNiTa, and CoFeNiHf, can also be made according to this invention. The designed composition can be decomposed not only to two materials, but three or more materials with low saturation magnetization. The target shape is not limited to a circular one. Similar configuration to that in FIG. 3 can be used for a rectangular composite target as long as the boundaries between sectors are approximately perpendicular to the racetrack direction. The area near the center of FIG. 3 might not be sputtered. Therefore, the center portion of the target can be taken out or made with other materials. The number of rings of FIG. 4 can be 3, 4, or more.

EXAMPLE 5

In yet another embodiment, high-saturation magnetization composite soft magnetic films can be deposited with sintered targets made of preferably at least two kinds of powders/elements with much lower saturation magnetization than that of the film deposited using the target.

Sintered targets are disclosed in U.S. Pat. No. 6,033,536, which is incorporated herein by reference.

The pie-shaped and ring-shaped targets of FIGS. 3 and 4 are suitable for magnetron sputtering of magnetically soft materials. The targets with pie-shaped sectors require that two kinds of sectors have similar saturation magnetization. The targets with nested ring-shaped sectors need at least three separated power supplies for firing the targets. The embodiment with sintered targets discloses another approach under the disclosed concept of decomposition in U.S. Ser. No. 10/067,833, issued as U.S. Pat. No. 6,692,619, but does not requires the similarity of saturation magnetization of these two kinds of sectors and at least three separated power supplies.

Figure 6:
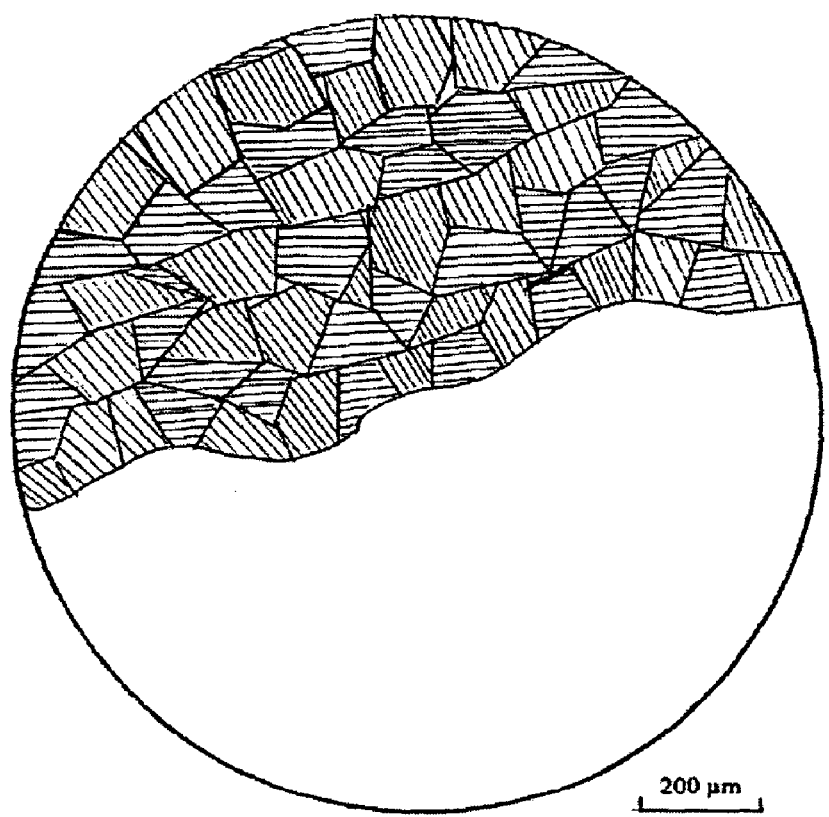
FIG. 6 shows an embodiment of a sintered target.
Figure 6:
Figure 6:

High-saturation magnetization composite soft magnetic films can be deposited with sintered targets. FIG. 6 is a schematic illustration of the structure of a sintered target made of two kinds of primary constituent elements/phases, A and B. Small areas which are not filled with lines could represent voids.

For example, targets of a single-phase material of $FeNi_{46.4}$ can be replaced with sintered targets made of substances of Ni and $FeNi_{32}$, which represent 32-weight % of Ni and 68-weight % of Fe. The saturation magnetization of $FeNi_{32}$ and Ni is much lower than that of $FeNi_{46.4}$. The saturation magnetization of a sintered target of $FeNi_{32}$ and Ni substances is much lower than that of a $FeNi_{46.4}$ single-phase target. The composition of deposited films made with a sintered target of $FeNi_{32}$ and Ni phases can be identical with that of deposited films made with the single-phase target, $FeNi_{46.4}$, as long as the total weight percentage of Fe or Ni in the sintered target is substantially identical to that of Fe or Ni in the single-phase target. In this case, when the weight of Ni powders is 21.2% of the total weight of Ni and $FeNi_{32}$ powders, the composition of the films deposited with these two kinds of targets would theoretically be identical.

In general, the calculation of the precise percentage of each materials could be done by (a) assuming that P is the weight percentage of element Z in the designed resultant films, then, (b) assuming that Pa, Pb, Pc, etc. are the weight percentage of element Z in the powder phases A, B, C, etc. respectively, and (c) assuming Xa, Xb, Xc, etc. are the weight percentage of powder phases A, B, C etc. in all powders including A, B, and C, etc.

$$P = Pa*Xa + Pb*Xb + Pc*Xc + \quad (7)$$

$$Xa + Xb + Xc + \ldots = 1 \quad (8)$$

The summations in equations (7) and (8) are over all powder phases A, B, and C, etc. From equations (7) and (8), the weight percentage of powder phases A, B, C, etc. for making the targets can be determined.

The processes of making sputter targets using powder metallurgy include powder mixing, sintering, and machining. A typical microstructure of the finished target is sketched in FIG. 6. The size of each single-phase primary constituent region within the target should be less than 1 mm, preferably less than 200 μm. The starting material or materials, preferably in powder form, for each single-phase primary constituent region can be an element, an alloy, a compound or combinations thereof.

The sintered targets may comprise the primary constituent phases and solid solution phases of the primary constituent phases. For example, Ni and $FeNi_{32}$ could be the primary constituent phases for the sintered targets for making $FeNi_{46.4}$ films. The solid solution phases could be situated at the interface between different kinds of primary constituent phases. FeNi solid solution phase could be situated at the interface between Ni and $FeNi_{32}$ phases. The amount of solid solution phases could depend on the diffusion rate and cycle duration of the sintering process. The sintered targets may comprise also the primary constituent phases and compound phases of the primary constituent phases. The compound phases could be situated at the interface between different kinds of primary constituent phases. The amount of the compound phases could depend on diffusion rate and can be controlled.

The sintering process can be hot pressing, hot isostatic pressing (HIP'ing) or any other sintering method. Materials are brought into a contact state under a suitable pressure and a temperature to induce the diffusion of atoms across and along the abutted interface. The sintering temperature is preferably less than the liquid phase appearing temperature, i.e., the melting temperature ($T_m$), of the primary constituent elements. Sintering commonly involves the heat treatment of powder compacts at elevated temperatures, usually at $T>0.5T_m[K]$, in the temperature range where diffusion mass transport is appreciable. In some instances, sintering can proceed only locally (i.e. at contact point of grains), without any appreciable change in the average overall density of a powder compact. The sintering process features much better composition control than casting process, and much finer and more uniform grain structure of the targets than casting.

The sintering process can be one of the following: (1) Solid-state sintering, where all densification is achieved through changes in particle shape, without particle rearrangement or the presence of liquid. (2) Liquid-phase sintering, where some liquid that is present at sintering temperatures aids compaction. Grain rearrangement occurs in the initial stage followed by a solution-reprecipitation stage. Usually, the liquid amount is not sufficient to fill the green-state porosity in normal liquid-assisted sintering of ceramics. In many instances, supposedly solid state sintering proceeds in the presence of previously undetected (or transient) small amounts of liquid (perhaps introduced as impurities during the powder preparation stage, such as silicates in oxide ceramics $Al_2O_3$, $ZrO_2$).

Due to the relatively small primary constituent single-phase region, uniform distribution of each primary constituent phases and cosine distribution of the sputtering, the deposited films made from a sintered target have uniform thickness and composition distribution in film plane and along the depth of the film. The deposited film could be a single phase or multi-phases films.

Magnetically soft materials, such as, NiFe, NiFeNb, FeCo, FeCoB, FeCoTaZr, and FeCoC, can be deposited using sintered targets.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application discloses several numerical range limitations. Persons skilled in the art would recognize that the numerical ranges disclosed inherently support any range within the disclosed numerical ranges even though a precise range limitation is not stated verbatim in the specification because this invention can be practiced throughout the disclosed numerical ranges. A holding to the contrary would "let form triumph over substance" and allow the written description requirement to eviscerate claims that might be narrowed during prosecution simply because the applicants broadly disclose in this application but then might narrow their claims during prosecution. Finally, the entire disclosure of the patents and publications referred in this application are hereby incorporated herein by reference.

What is claimed is:

1. A target for magnetron sputtering, comprising a plurality of species that form a film comprising a material of higher saturation magnetization than that of the species, wherein the target is a sintered target.

2. The target of claim 1, wherein the target is made of at least two kinds of powders of a lower saturation magnetization than that of a film deposited using the target.

3. The target of claim 1, wherein the target sputters to form a film having a substantially uniform thickness and a substantially uniform composition throughout the film.

4. The target of claim 1, wherein the target comprises multiple single-phase regions.

5. The target of claim 4, wherein each single-phase region is less than 1 mm in size.

6. The target of claim 4, wherein each single-phase region is less than 200 μm in size.

7. The target of claim 4, wherein the multiple single-phase regions comprise a phase comprising Fe, Ni, B, Co, Ta, Zr, C or combinations thereof.

8. The target of claim 1, wherein the sintering process is a hot pressing process or a hot isostatic pressing process.

9. The target of claim 1, wherein the sintered target is formed from a material selected from the group consisting of a simple element, an alloy, a compound and combination thereof.

10. A sputtering source, comprising a magnet and means, made by a sintering process, for sputtering a plurality of species that form a film comprising a material of higher saturation magnetization than that of the species.

11. A sputtering method, comprising disposing a substrate opposite a target, applying a magnetic field to the target, applying a sputtering voltage to the target and sputtering a film on the substrate, the target comprising a plurality of species that form a film comprising a material of higher saturation magnetization than that of the species, wherein the target is a sintered target.

12. The method of claim 11, wherein the target is made of at least two kinds of powders of a lower saturation magnetization than that of a film deposited using the target.

13. The method of claim 11, wherein the target sputters to form a film having a substantially uniform thickness and a substantially uniform composition throughout the film.

14. The method of claim 11, wherein the target comprises multiple single-phase regions.

15. The method of claim 14, wherein each single-phase region is less than 1 mm in size.

16. The method of claim 14, wherein each single-phase region is less than 200 μm in size.

17. The method of claim 14, wherein the multiple single-phase regions comprise a phase comprising Fe, Ni, B, Co, Ta, Zr, C or combinations thereof.

18. The method of claim 11, wherein the sintering process is a hot pressing process or a hot isostatic pressing process.

* * * * *